(12) United States Patent
Wicker et al.

(10) Patent No.: US 9,343,676 B2
(45) Date of Patent: May 17, 2016

(54) HEATING PHASE CHANGE MATERIAL

(71) Applicant: Micron Technology, Inc., Boise, ID (US)

(72) Inventors: Guy C. Wicker, Southfield, MI (US); Fabio Pellizzer, Follina (IT); Enrico Varesi, Milan (IT); Agostino Pirovano, Corbetta (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/167,122

(22) Filed: Jan. 29, 2014

(65) Prior Publication Data

US 2014/0147965 A1    May 29, 2014

Related U.S. Application Data

(62) Division of application No. 11/103,188, filed on Apr. 11, 2005, now Pat. No. 8,653,495.

(51) Int. Cl.
  *H01L 45/00* (2006.01)
  *G11C 13/00* (2006.01)
  *H01L 27/24* (2006.01)

(52) U.S. Cl.
  CPC .......... *H01L 45/1608* (2013.01); *G11C 13/003* (2013.01); *G11C 13/0004* (2013.01); *H01L 27/2427* (2013.01); *H01L 45/04* (2013.01); *H01L 45/06* (2013.01); *H01L 45/122* (2013.01); *H01L 45/1246* (2013.01); *H01L 45/141* (2013.01); *H01L 45/144* (2013.01); *H01L 45/1675* (2013.01); *G11C 2213/76* (2013.01)

(58) Field of Classification Search
  CPC ................ H01L 45/1233; H01L 45/06; H01L 45/04–45/1666
  USPC ........................................................ 438/102
  IPC . G11C 13/0004, 13/003, 2213/76; H01L 45/04, H01L 45/06, 45/1608, 45/141, 45/144, 45/1675, H01L 27/2427, 45/122, 45/1246
  See application file for complete search history.

(56) References Cited

U.S. PATENT DOCUMENTS 4,115,872 A * 9/1978 Bluhm .......................... 365/163
4,203,123 A * 5/1980 Shanks ............................. 257/2

(Continued)

FOREIGN PATENT DOCUMENTS

DE      DD251225       11/1987
KR       626388         9/2006

(Continued)

OTHER PUBLICATIONS

International Search Report for International Application No. PCT/US2006/012988, dated Sep. 29, 2006.

(Continued)

Primary Examiner — Hrayr A Sayadian
(74) Attorney, Agent, or Firm — Dorsey & Whitney LLP

(57) ABSTRACT

A phase change memory may be formed of two vertically spaced layers of phase change material. An intervening dielectric may space the layers from one another along a substantial portion of their lateral extent. An opening may be provided in the intervening dielectric to allow the phase change layers to approach one another more closely. As a result, current density may be increased at this location, producing heating.

18 Claims, 4 Drawing Sheets

(56) References Cited

U.S. PATENT DOCUMENTS

| | | | |
|---|---|---|---|
| 5,825,046 | A | 10/1998 | Czubatyj et al. |
| 5,920,788 | A * | 7/1999 | Reinberg ............... 438/466 |
| 5,933,365 | A * | 8/1999 | Klersy et al. ............ 365/148 |
| 6,114,713 | A | 9/2000 | Zahorik |
| 7,056,762 | B2 | 6/2006 | Moore et al. |
| 2003/0071289 | A1 * | 4/2003 | Hudgens et al. ......... 257/246 |
| 2003/0155589 | A1 * | 8/2003 | Campbell et al. ........ 257/225 |
| 2004/0012009 | A1 | 1/2004 | Casagrande et al. |
| 2004/0043585 | A1 * | 3/2004 | Moore et al. ............ 438/510 |
| 2004/0113137 | A1 * | 6/2004 | Lowrey .................... 257/5 |
| 2004/0114413 | A1 | 6/2004 | Parkinson et al. |
| 2004/0197976 | A1 * | 10/2004 | Rodgers et al. .......... 438/200 |
| 2005/0017233 | A1 | 1/2005 | Campbell |
| 2005/0018526 | A1 | 1/2005 | Lee |
| 2005/0029505 | A1 | 2/2005 | Lowrey |
| 2005/0030800 | A1 * | 2/2005 | Johnson et al. .......... 365/200 |
| 2005/0180216 | A1 | 8/2005 | Lowrey |
| 2005/0226036 | A1 * | 10/2005 | Aratani et al. ........... 365/158 |
| 2006/0226410 | A1 | 10/2006 | Wicker et al. |

FOREIGN PATENT DOCUMENTS

| | | |
|---|---|---|
| WO | WO-2005/017904 | 2/2005 |
| WO | WO-2006/072842 | 7/2006 |
| WO | WO 2006/110518 | 10/2006 |

OTHER PUBLICATIONS

Written Opinion of the International Searching Authority for International Application No. PCT/US2006/012988, dated Sep. 29, 2006.
English Translated Taiwan Office Action from the Taiwan Patent Office for application No. 92105507 dated Nov. 3, 2008, 4 pages.

* cited by examiner

HEATING PHASE CHANGE MATERIAL

CROSS REFERENCE TO RELATED APPLICATION(S)

This application is a divisional of U.S. patent application Ser. No. 11/103,188, filed Apr. 11, 2005, and issued as U.S. Pat. No. 8,653,495 on Feb. 18, 2014. This application and patent are incorporated herein by reference, in their entirety, for any purpose.

TECHNICAL FIELD

This invention relates generally to phase change memories.

BACKGROUND OF THE INVENTION

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

In phase change memories, a heater heats the phase change material to change the state of the phase change material. These heaters may consume sufficient power to be an issue in some applications, such as in those applications that rely on battery power. In addition, the heater may add to the size of the phase change memory device.

Thus, there is a need for better ways to heat phase change memories.

DETAILED DESCRIPTION

Figure 1:
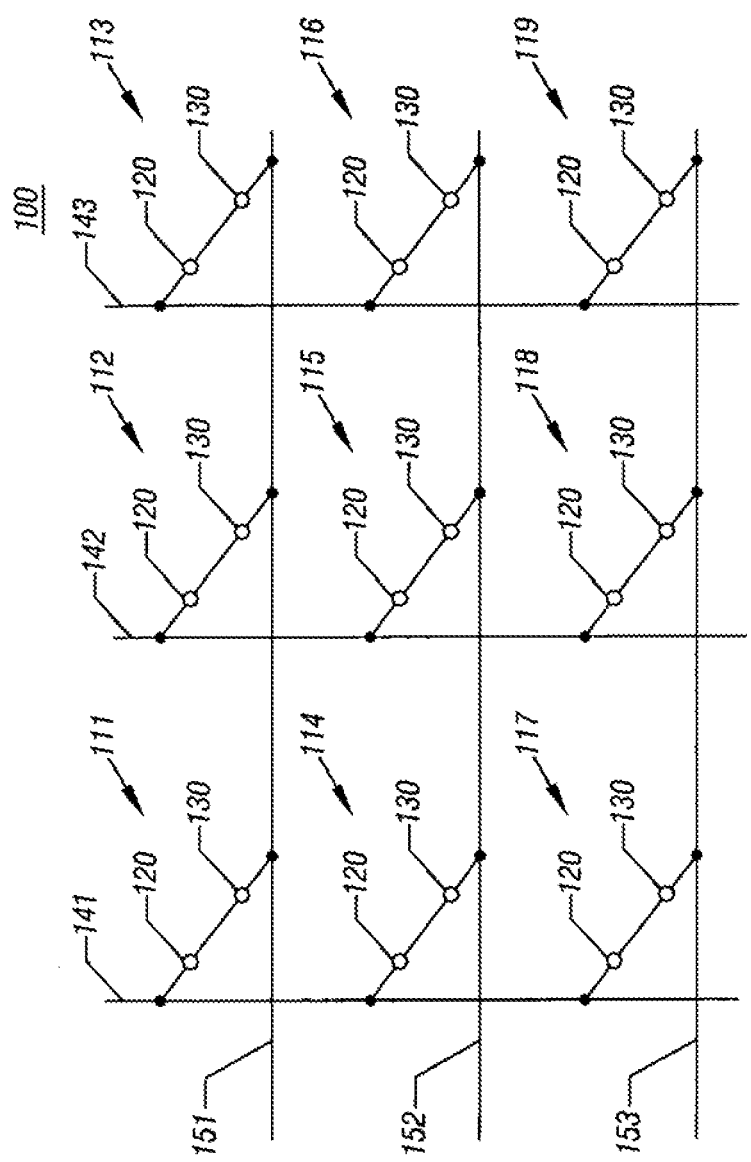
FIG. 1 is a schematic depiction of a phase change memory in accordance with one embodiment of the present invention.

Turning to FIG. 1, an embodiment of a memory 100 is illustrated. Memory 100 may include a 3×3 array of memory cells 111-119, wherein memory cells 111-119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current.

Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141-143 and row lines 151-153 to select a particular memory cell of the array during a write or read operation.

Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 may be connected to row lines 151-153 and may be coupled to column lines 141 143 via select device 120. While one select device 120 is depicted, more select devices may also be used Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. The select device 120 may also be called an access device, a threshold device, an isolator device or a switch. It may be implemented as a MOS transistor, a bipolar junction transistor, a diode or an ovonic threshold switch.

Figure 2:
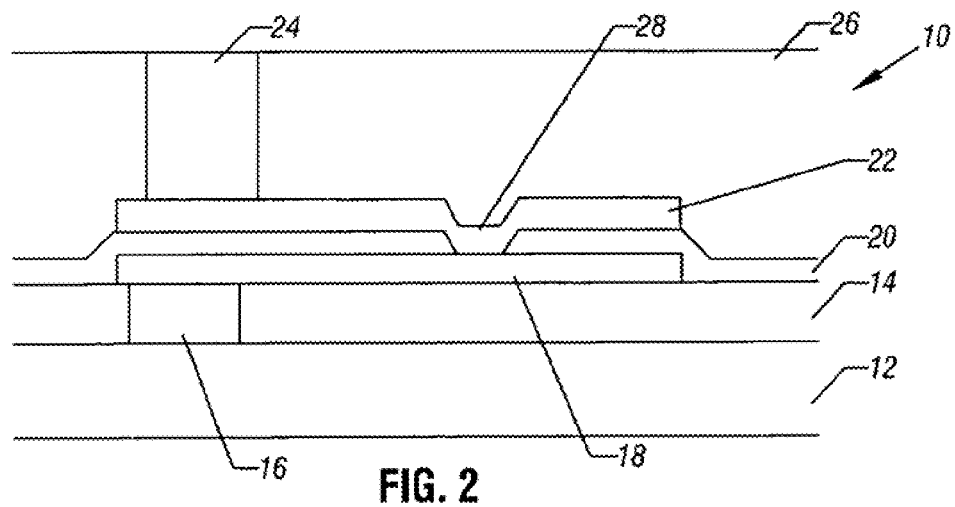
FIG. 2 is an enlarged, cross-sectional view of a phase change memory in accordance with one embodiment of the present invention.

Referring to FIG. 2, in accordance with one embodiment of the present invention, a phase change memory cell 10 may be formed over a substrate 12 such as a silicon substrate. The cell 10 may correspond to the cells 111-119. A lower contact 16 may be formed within an insulating layer 14 in one embodiment of the present invention. Over the insulating layer 14 may be a first patterned chalcogenide material 18 to form the select device 120 of FIG. 1.

The first patterned chalcogenide material 18 and the exposed insulating layer 14 may be covered by an insulating layer 20 in accordance with one embodiment of the present invention. The insulating layer 20 may have an opening 28. The layer 20 may be partially covered by a second patterned chalcogenide material 22 in accordance with one embodiment of the present invention. The material 22 may fill the opening 28 and contact the material 18 in one embodiment. The material 22 forms the memory element 130 of FIG. 1.

The layer 22 is, in turn, contacted by an upper contact 24 formed in still another insulating layer 26.

As a result of the opening 28 through the layer 20, a "bottleneck" is created for current flowing between the first patterned chalcogenide material 18 and the second patterned chalcogenide material 22. In other words, the current primarily flows, not through the insulator 20, but directly between the first patterned chalcogenide material and the second patterned chalcogenide material 22 at the bottleneck created by the opening 28 in the insulating layer 20.

The higher current density through the opening 28 leads to power dissipation at the point of contact between the chalcogenide materials 18 and 22.

This results in efficient heating. The heating may be utilized to change the state of either or both of the first or second chalcogenide materials 18 and 22.

Materials 18 and 22 can both be chalcogenide memory alloys, in order to make an efficient memory element 130. In this case, the select device 120 may be made in the underlying substrate.

Figure 3:
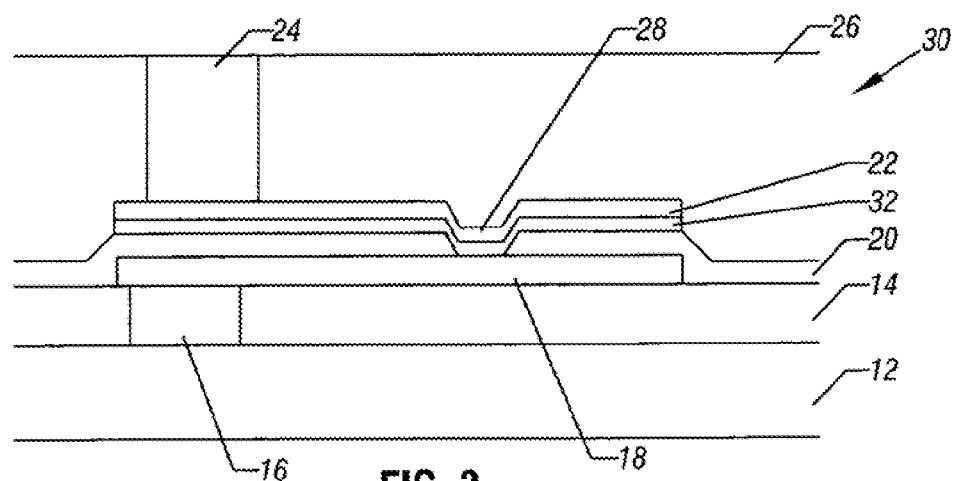
FIG. 3 is an enlarged, cross-sectional view of a phase change memory in accordance with still another embodiment of the present invention.

Referring to FIG. 3, in accordance with another embodiment of the present invention, the cell 30 is similar to the cell 10. However, in the case of the cell 30, a resistive layer 32 is situated between the insulating layer and the second patterned chalcogenide material 22.

The resistive layer 32 may be a dielectric or insulating layer such as silicon nitride with a thickness of between about 10 and 50 Angstroms. When the cell 30 is first programmed, the potential developed across the layer 32 can cause it to break down in one small area of the opening 28 in the insulating layer 20. This breakdown location or filament further reduces the area of contact between the chalcogenide materials 18 and 22, increasing the current density or power dissipation.

The layer 32 may also be a more resistive chalcogenide alloy, such as germanium, antimony, tellurium alloy with nitrogen incorporated into the film to increase its resistivity. In one embodiment less than 10% nitrogen is used.

That higher resistivity material at the area of contact between the chalcogenide materials 18 and 22 dissipates more power and heats the region more effectively.

The more conductive chalcogenide materials 18 and 22 carry current from the small region of programming to the electrical contacts 16 and 24, which are located away from the programming region created at the opening 28. Because the chalcogenide materials 18 and 22 are conductive and because the current density away from the contact region is much smaller, there may be lower power dissipation in the chalcogenide materials 18, 22 away from the contact region in some embodiments. Thus, this contact region away from the opening 28 need not change phase and remains relatively highly conductive. By reducing the area that changes phase, power dissipation may be reduced in some embodiments. This power consumption reduction may allow the memory cell 30 to cycle with lower current than current embodiments of phase change memories.

Figure 4:
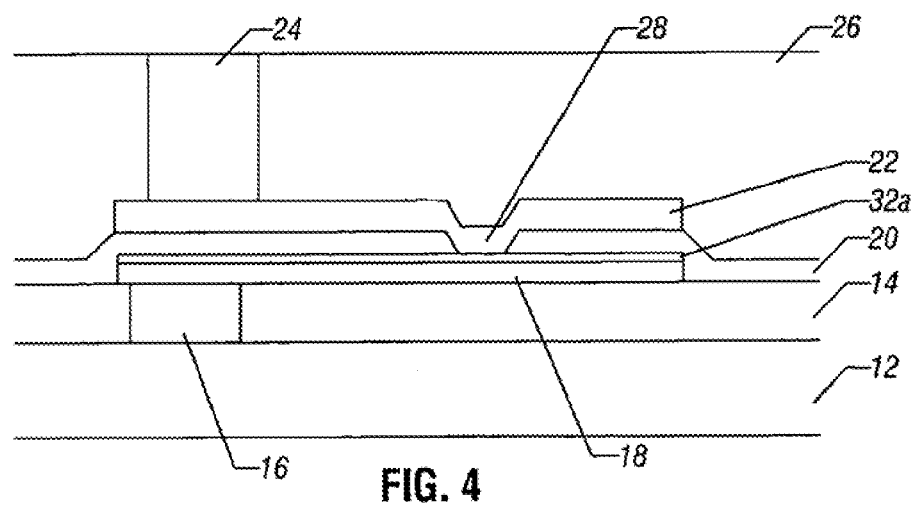
FIG. 4 is an enlarged, cross-sectional view of still another embodiment of the present invention.

Referring to FIG. 4, in this embodiment, the resistive layer 32a is placed on the first patterned chalcogenide material 18. Otherwise, the structure is similar to that of FIG. 3.

Figure 5:
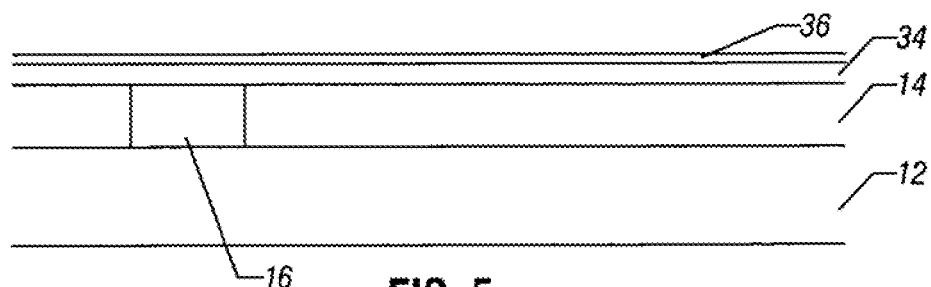
FIG. 5 is an enlarged, cross-sectional view of the embodiment shown in FIG. 4 at an early stage of manufacture in accordance with one embodiment of the present invention.
Figure 6:
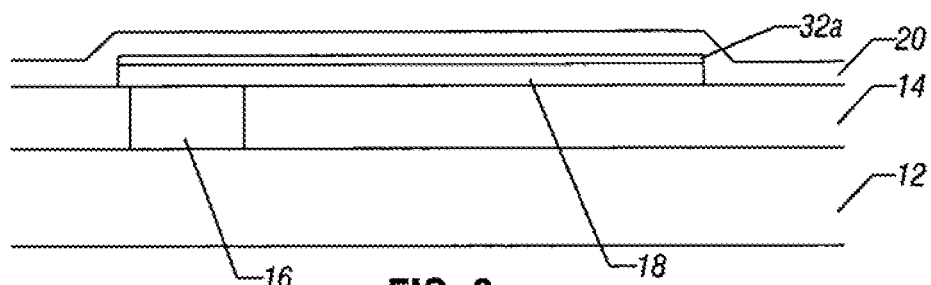
FIG. 6 is an enlarged, cross-sectional view of the embodiment shown in FIG. 5 at a subsequent stage of manufacture in accordance with one embodiment of the present invention.

Taking the embodiment of FIG. 4 as an example, FIGS. 5-8 show an example of a fabrication process in accordance with one embodiment of the present invention. The layers 34 of chalcogenide material and 36 of the resistive material may be deposited over the insulating layer 14 and the contact 16 as shown in FIG. 5. Those layers 34, 36 may then be patterned to form the first patterned chalcogenide material 18 and the resistive layer 32a. That stack of material 18 and layer 32a may then be covered with an insulating layer 20 as shown in FIG. 6.

Figure 7:
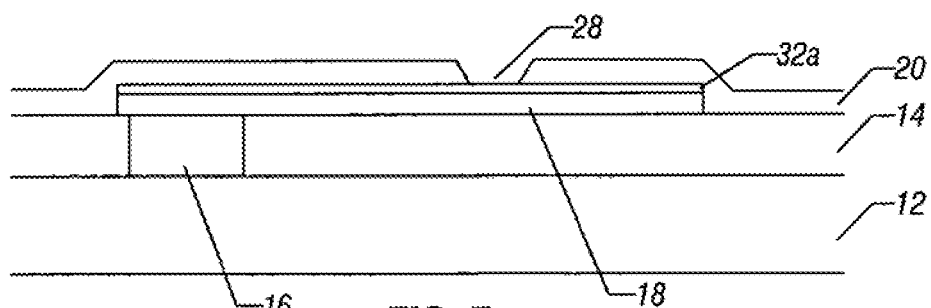
FIG. 7 is an enlarged, cross-sectional view of the embodiment shown in FIG. 6 at a subsequent stage of manufacture in accordance with one embodiment of the present invention.
Figure 8:
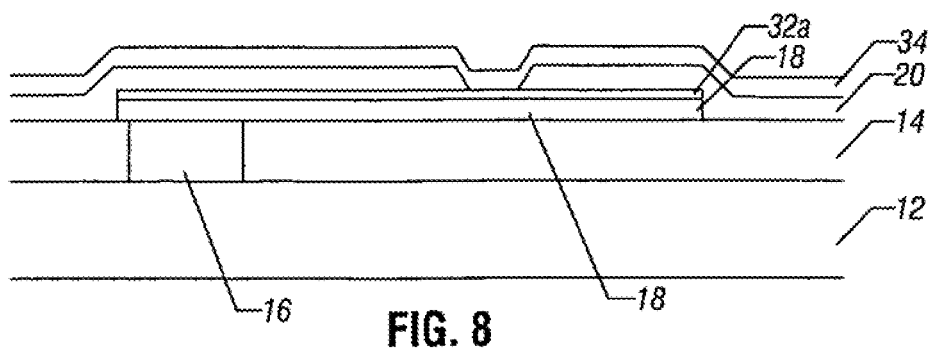
FIG. 8 is an enlarged, cross-sectional view of the embodiment shown in FIG. 7 at a subsequent stage of manufacture in accordance with one embodiment of the present invention.

Then, as shown in FIG. 7, an opening 28 may be formed through the insulating layer 20 in a position spaced from the contact 16. The chalcogenide layer 34 may be deposited so that a portion thereof extends into the opening 28.

The layer 34 may be patterned to form the second pattern chalcogenide material 22, shown in FIG. 4. Thereafter, the layer 26 may be deposited, an opening formed therein, and the upper contact 24 formed therein, as also shown in FIG. 4.

The substrate 12 may be, for example, a semiconductor substrate (e.g., a silicon substrate), although the scope of the present invention is not limited in this respect.

Other suitable substrates may be but are not limited to, substrates that contain ceramic material, organic material; or a glass material.

The insulating layer 14 may be formed using, for example, a PECVD (Plasma Enhanced Chemical Vapor Deposition) process, HDP (High Density Plasma) process, or spin-on and bake sol gel process. Insulating layer 14 can be a dielectric material that may be a thermally and/or electrically insulating material such as, for example, silicon dioxide, although the scope of the present invention is not limited in this respect. Insulating layer 14 may have a thickness ranging from about 100 A to about 4000 A, although the scope of the present invention is not limited in this respect. In one embodiment, the thickness of insulating layer 14 may range from about 500 A to about 2500 A.

Although the scope of the present invention is not limited in this respect, insulating layer 14 may be planarized using a chemical or chemical mechanical polishing (CMP) technique.

The material 22 may be a phase change, program programmable material capable of being programmed into one of at least two memory states by applying a current to material 22 to alter the phase of material 22 between a substantially crystalline state and a substantially amorphous state, wherein a resistance of the material 22 in the substantially amorphous state is greater than the resistance of the material 22 in the substantially crystalline state. Programming of switching material 22 to alter the state or phase of the material may be accomplished by applying voltage potentials to contacts 16 and 24, thereby generating a voltage potential across select device 120 and memory element 130. When the voltage potential is greater than the threshold voltage of select device 120 and memory element 130, then an electrical current may flow through memory material 22 in response to the applied voltage potential, and may result in heating of memory material 22 at the opening 28.

This heating may alter the memory state or phase of memory material 22. Altering the phase or state of memory material 22 may alter the electrical characteristic of memory material 22, e.g., the resistance of the material may be altered by altering the phase of the memory material 22. Memory material 22 may also be referred to as a programmable resistive material.

In the "reset" state, memory material 22 may be in an amorphous or semi-amorphous state and in the "set" state, memory material 22 may be in an a crystalline or semi-crystalline state. The resistance of memory material 20 in the amorphous or semi-amorphous state may be greater than the resistance of memory material 22 in the crystalline or semi-crystalline state. It is to be appreciated that the association of reset and set with amorphous and crystalline states, respectively, is a convention and that at least an opposite convention may be adopted.

Using electrical current, memory material 22 may be heated to a relatively higher temperature to amorphosize memory material 22 and "reset" memory material 22 (e.g., program memory material 22 to a logic "0" value). Heating the volume of memory material 22 to a relatively lower crystallization temperature may crystallize memory material 22 and "set" memory material 22 (e.g., program memory material 22 to a logic "1" value). Various resistances of memory material 22 may be achieved to store information by varying the amount of current flow and duration through the volume of memory material 22.

Although the scope of the present invention is not limited in this respect, in one example, the composition of ovonic switching material 22 may comprise a Si concentration of about 14%, a Te concentration of about 39%, an As concentration of about 37%, a Ge concentration of about 9%, and an In concentration of about 1%. In another example, the composition of switching material 22 may comprise a Si concentration of about 14%, a Te concentration of about 39%, an As concentration of about 37%, a Ge concentration of about 9%, and a P concentration of about 1%, In these examples, the percentages are atomic percentages which total 100% of the atoms of the constituent elements.

In another embodiment, a composition for ovonic switching material 22 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, ovonic switching material 22 may include Si, Te, As, Ge, sulfur (S), and selenium (Se). As an example, the composition of switching material 940 may comprise a Si concentration of about 5%, a Te concentration of about 34%, an As concentration of about 28%, a Ge concentration of about 11%, a S concentration of about 21%, and a Se concentration of about 1%.

Conductive material (not shown) may be applied to contact 24 in the form of a thin film material having a thickness ranging from about 20 A to about 2000 A. In one embodiment, the thickness of the material 28 may range from about 100 A to about 1000 A. In another embodiment, the thickness of the film material may be about 300 A.

Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 24.

Figure 9:
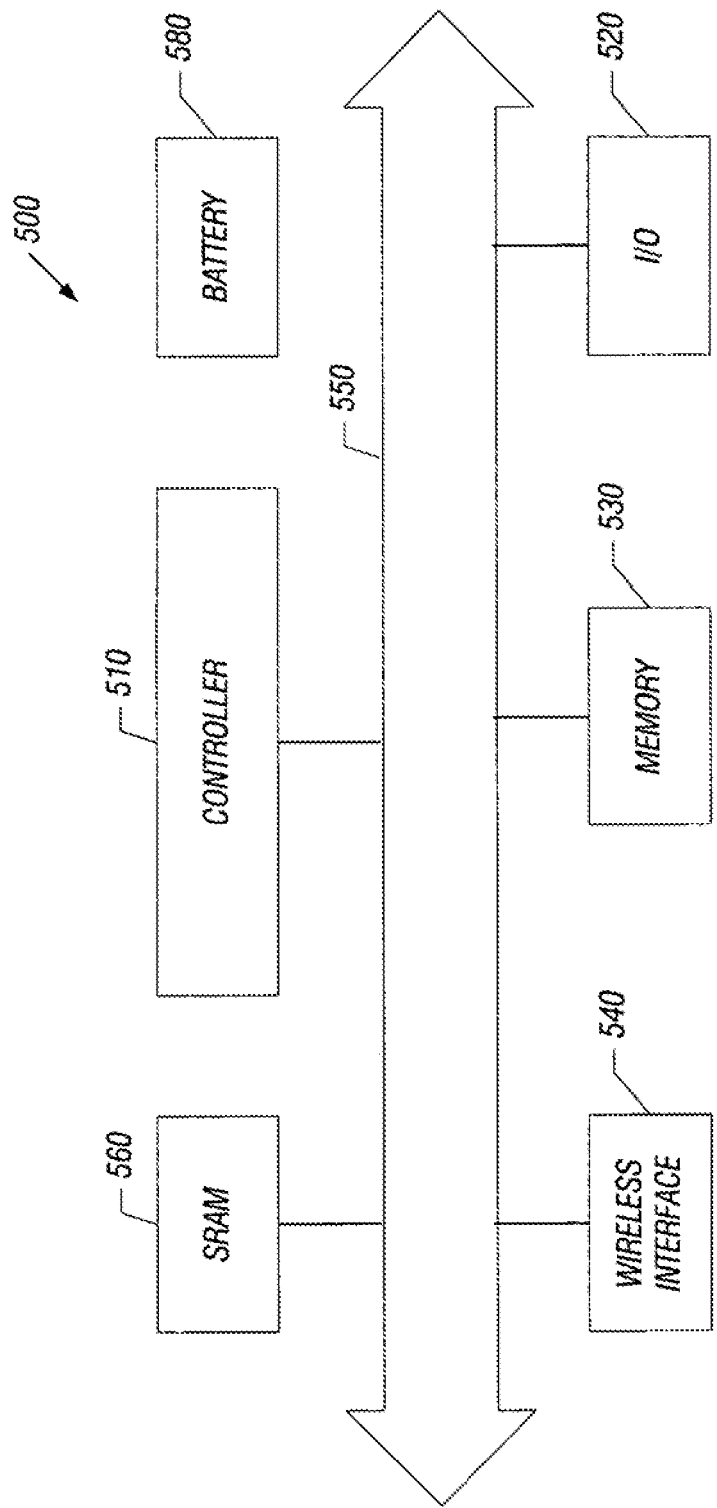
FIG. 9 is a schematic depiction of a system in accordance with one embodiment of the present invention.

System 500 of FIG. 9 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   spacing a pair of chalcogenide layers by first and second intervening layers, wherein said first and second intervening layers are disposed between a top surface of a first chalcogenide layer of said pair of chalcogenide layers and a bottom surface of a second chalcogenide layer of said pair of chalcogenide layers, wherein the second intervening layer is silicon nitride; and
   forming an opening through said first intervening layer to reduce spacing between said pair of chalcogenide layers.

2. The method of claim 1 including forming said chalcogenide layers of different chalcogenide materials.

3. The method of claim 2 including forming a select device of one of said chalcogenide layers and forming a memory element of the other of said chalcogenide layers.

4. The method of claim 1 including forming a first and second contact such that said first contact contacts one of said chalcogenide layers and said second contact contacts the other chalcogenide layer.

5. The method of claim 4 including spacing said contacts away from said opening along the length of said chalcogenide layers.

6. The method of claim 5 including aligning said contacts to one another.

7. The method of claim 1 including forming said first and second intervening layers of a material that is more resistive than said chalcogenide layers.

8. The method of claim 1 including completely separating said chalcogenide layers with said second intervening layer.

9. The method of claim 1 including contacting said first chalcogenide layer and said second intervening layer at said opening.

10. The method of claim 1 including forming said second intervening layer directly on one of said chalcogenide layers.

11. A method comprising:
    disposing first and second intervening layers between first and second chalcogenide layers, wherein the first intervening layer is disposed on a top surface of the second intervening layer; and
    forming an opening in the second intervening layer so that the first intervening layer contacts the first and second chalcogenide layers only within the opening, wherein the first intervening layer is silicon nitride.

12. The method of claim 11, wherein the second intervening layer is an insulator.

13. The method of claim 11, wherein the first and second chalcogenide layers are different.

14. The method of claim 11, wherein the first intervening layer has a greater resistance than the first and second chalcogenide layers.

15. The method of claim 11, wherein the first intervening layer is about 10 to 50 Angstroms in thickness.

16. The method of claim 11, further comprising:
forming a first contact to the first chalcogenide layer; and
forming a second contact to the second chalcogenide layer, wherein the first and second contacts are formed a distance away from the opening in the first intervening layer.

17. A method comprising:
forming openings in an insulating layer disposed between first and second chalcogenide layers, wherein a top side of the insulating layer contacts a bottom side of the first chalcogenide layer; and
depositing an intervening layer between the second chalcogenide layer and the insulating layer, wherein the intervening layer directly contacts the first and second chalcogenide layers in the openings formed in the insulating layer, wherein the insulating material is silicon nitride.

18. The method of claim 17, wherein the first and second chalcogenide layers are of different compositions.

* * * * *